(12) United States Patent
He et al.

(10) Patent No.: US 6,355,965 B1
(45) Date of Patent: Mar. 12, 2002

(54) ON-CHIP FIXED PATTERN NOISE CANCELING LOGARITHMIC RESPONSE IMAGER SENSOR

(75) Inventors: Xingping He, San Jose; Tiemin Zhao, Palo Alto, both of CA (US)

(73) Assignee: Omnivision Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/538,031

(22) Filed: Mar. 29, 2000

(51) Int. Cl.[7] ............................................... H01L 27/14
(52) U.S. Cl. ....................................... 257/431; 348/302
(58) Field of Search ................................ 257/431, 290, 257/291, 440, 446, 444; 348/302

(56) References Cited

U.S. PATENT DOCUMENTS 5,933,190 A * 8/1999 Dierickx et al. ............ 348/302

* cited by examiner

*Primary Examiner*—Nathan Flynn
*Assistant Examiner*—Leonardo Andujar
(74) *Attorney, Agent, or Firm*—Blakely Sokoloff Taylor & Zafman, LLP (57) ABSTRACT

An improved pixel structure for a logarithm response image sensor. The pixel structure and read-out sequence provides a method to get a signal free from offsets and gain mismatch due to nonuniformities in the device parameters. An additional transistor is added to a basic logarithmic response pixel structure in order to provide a means for producing a calibration signal level. The calibration transistor is either coupled within the pixel structure itself, or to an extra column line that is coupled to a voltage source. The calibration transistor is therefore not coupled to an extra column line with a calibration current source, and therefore does not have the additional circuitry, power consumption, or control issues associated with a calibration current source type method.

18 Claims, 5 Drawing Sheets

ON-CHIP FIXED PATTERN NOISE CANCELING LOGARITHMIC RESPONSE IMAGER SENSOR

FIELD OF THE INVENTION

The present invention relates to metal oxide semiconductor (MOS) image sensors and, more particularly, to logarithmic response image sensors.

BACKGROUND OF THE INVENTION

Integrated circuit technology has revolutionized various fields including computers, control systems, telecommunications, and imaging. In the field of imaging, the charge coupled device (CCD) sensor has made possible the manufacture of relatively low cost and small hand-held video cameras. Nevertheless, the solid-state CCD integrated circuits needed for imaging are relatively difficult to manufacture, and therefore are expensive.

An alternative low cost technology to CCD integrated circuits is the metal oxide semiconductor (MOS) integrated circuit. Not only are imaging devices using MOS technology less expensive to manufacture relative the CCD imaging devices, for certain applications MOS devices are superior in performance. For example, the pixel elements in a MOS device can be made smaller and therefore provide a higher resolution than CCD image sensors. In addition, the signal processing logic necessary can be integrated alongside the imaging circuitry, thus allowing for a single integrated chip to form a complete stand alone imaging device.

Two of the categories of CMOS image sensors are linear and logarithmic. In linear sensors, the exposure to light generates a small current in a photosensitive device (such as an inversely polarized photodiode), which is used to charge or discharge a capacitor during a fixed time interval. The voltage on the capacitor after the integration time is proportioned to the incident light intensity and the fixed integration time.

In logarithmic sensors, the current in the photosensitive device produced by the incident light is measured directly. The current is usually converted to voltage through a MOS transistor. This transformation follows a logarithmic function, and can have a very high dynamic range (on the order of 100–120 dB or higher).

Figure 1:
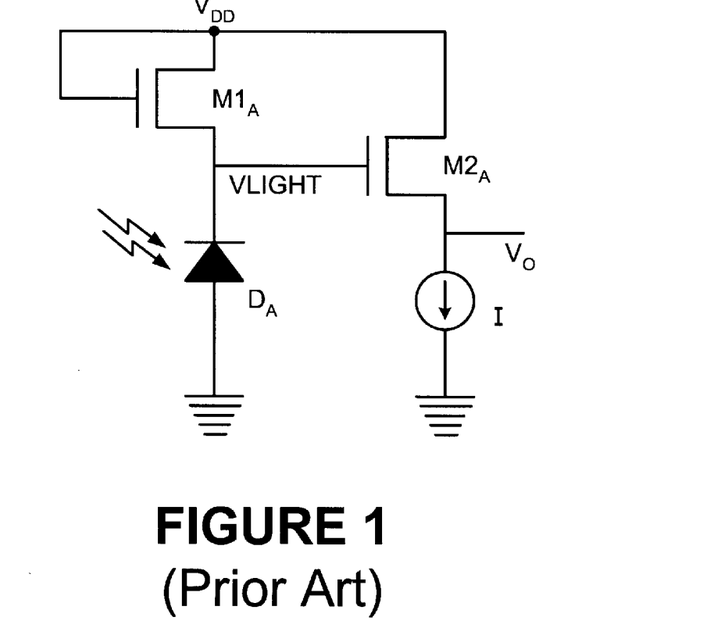
FIG. 1 is a schematic diagram of a prior art logarithmic response image sensor.

FIG. 1 shows a basic prior art logarithmic sensing cell. FIG. 1 has been reproduced from FIG. 4 of "Design of a Foveated Log-Polar Image Sensor in Standard CMOS Technology" (F. Pardo et al., *Design of Integrated Circuits and Systems*, DCIS '96, Sitges, Spain, November 1996). The following description is taken from that reference and explains how the cell works.

The current generated by the light in the photodiode flows through the transistor M1A. This current is very small (between pico and nano amperes), biasing the transistor in its weak inversion region. The second transistor M2A is just a source follower. In the weak inversion region, the simplified expression for the voltage between gate and source is:

$$V_{gs} = \frac{kT}{q} \ln\left(\frac{L}{W} \frac{I_d}{I_{do}}\right) \quad (1)$$

where $V_{gs}$ is the gate-source voltage, $I_d$ is the drain current, W and L are the width and length of the transistor channel, T is the temperature, and k, q and $I_{do}$ are constants. From this expression, the logarithmic dependency of the voltage with the current can be seen. It directly means that the response (voltage) is logarithmic with the incident light intensity (current).

Other prior art circuits have attempted to improve the light sensitivity of the basic logarithmic sensing cell. U.S. Pat. No. 5,933,190, to Dierickx et al., shows several circuits designed for this purpose. In a first embodiment, the '190 patent proposes increasing the lengths of the gates of transistors such as the load transistor in a circuit similar to FIG. 1. As a result of this increase in gate length, it is stated that the load transistor will saturate at lower current densities, and an increase in the sensitivity of the pixel for lower light intensities (current densities) will be achieved. This is based on the premise that the sensitivity of pixels at low light intensities may be limited by the leakage current through the load transistor.

Figure 2:
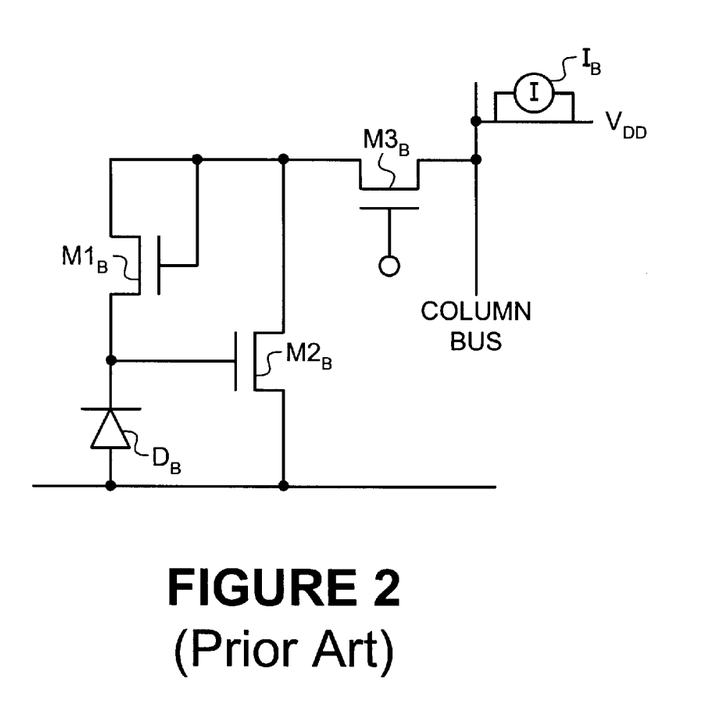
FIG. 2 is a schematic diagram of a prior art logarithmic response image sensor with an extended dynamic range.

Another embodiment in the '190 patent is shown in FIG. 4, which has been reproduced as FIG. 2 herein. As illustrated in FIG. 2, the drain of the load transistor M1B is not directly tied to the output signal supply. The read-out means consists of a second MOSFET M2B which is not a source follower and finally, a third MOSFET M3B which acts as a switch. A current source $I_B$ provides a current with a magnitude in the order of microamperes. The gate of the transistor M3B is tied to the address.

While the photodiode $D_B$ can also be considered a current source (of the order of femtoamperes to nanoamperes according to the intensity of light impinging the photodiode) the transistor M3B is conducting the current decharging through the transistor M2B. Such current can be defined by:

$$I_2 \sim c(V_G - V_{th}) \quad (2)$$

wherein c is a constant value.

As $I_2$ is given by the current source and is more or less a constant, we have then $V_G$ also nearly a constant. Therefore, the light acquired by the photodiode $D_B$ is converted into a voltage drop across the load transistor M1B. Accordingly, this pixel has similar functions as the one described in FIG. 1. Alternatively, this pixel can also be considered as a simple and classic resistive feedback amplifier.

As discussed in "On-Chip Offset Calibrated Logarithmic Response Image Sensor" (S. Kavadias et al., 1999 *IEEE Workshop on Charge-Coupled Devices and Advanced Image Sensors*, pp. 68–71), the major drawback of logarithmic CMOS image sensors (such as those illustrated in FIGS. 1 and 2) compared with their linear counterparts is the increased Fixed Pattern Noise (FPN). This noise is caused from the non-uniformities of the parameters associated with the various devices present on the sensor chip. It appears as an offset in the output signal delivered by each pixel. In linear integrating sensors the photocurrent is integrated on a capacitance over a well-defined time period, therefore methods for the elimination of this offset have been proposed based on the readout of the voltage of the integrating capacitance during two states. One widely used technique in linear integrating sensors is "correlated double sampling".

Sensors employing pixels with logarithmic response are very attractive devices in applications where a high dynamic range is required. However, they suffer from high FPN due to the non-availability of two distinct pixel levels as in the case of linear integrating sensors. A few prior art circuits have attempted to address the problem of the high FPN in logarithmic image sensors. One general approach has been to develop a known reference for each pixel, against which the output of the signal can be calibrated.

One way to develop a known reference level for each pixel circuit in an array is to use a known reference current to produce an output from the pixel circuit, similar to how the current from a photodiode would produce an output. By using a known reference current for each of the pixel circuits, a reference level for each of the pixel circuits can be obtained. This technique is described in more detail in "On-Chip Offset Calibrated Logarithmic Response Image Sensor" (supra). FIGS. 1 and 2 of that reference have been reproduced as FIGS. 3A and 3B herein.

Figure 3A:
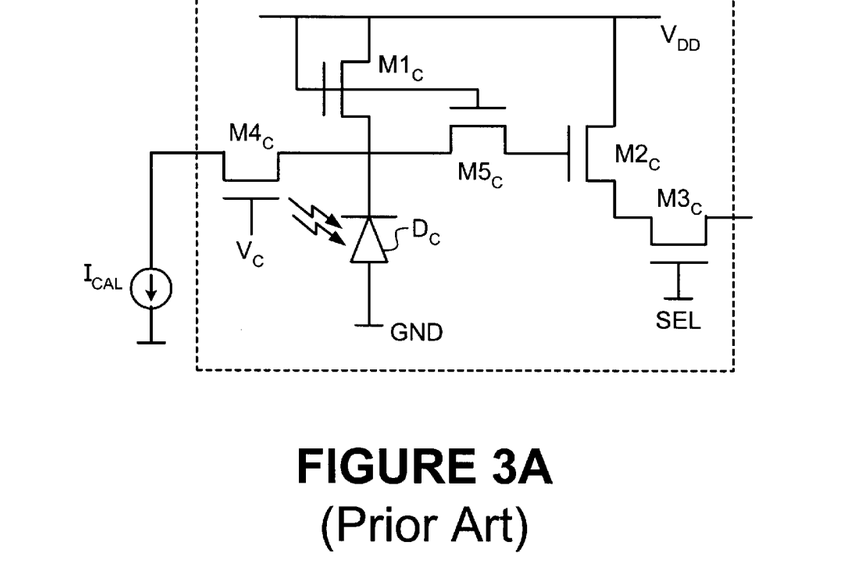
FIGS. 3A and 3B are schematic diagrams of a prior art logarithmic response image sensor utilizing an additional current source column line to produce a calibration signal level.

FIG. 3A shows a basic pixel structure, where transistor M1C acts as the bias of the photodiode and provides the logarithmic response. Transistor M2C is the driver transistor of the on-pixel source follower and transistor M3C is used for row selection. Transistor M4C connects the pixel to the calibration source $I_{CAL}$ which is common for pixels lying on the same column. Transistor M5C connects the output of photodiode $D_C$ to the gate of transistor M2C. The calibration process is accomplished in two states. First, transistor M4C is switched off and the pixel voltage is stored. This voltage is logarithmically related to the photocurrent delivered by the photodiode $D_C$. Then transistor M4C is switched on and the pixel output is again sampled and extracted from the previous level. The difference between these two levels has a very small offset, provided that $I_{CAL}$ is much higher than the photocurrent.

Figure 3B:
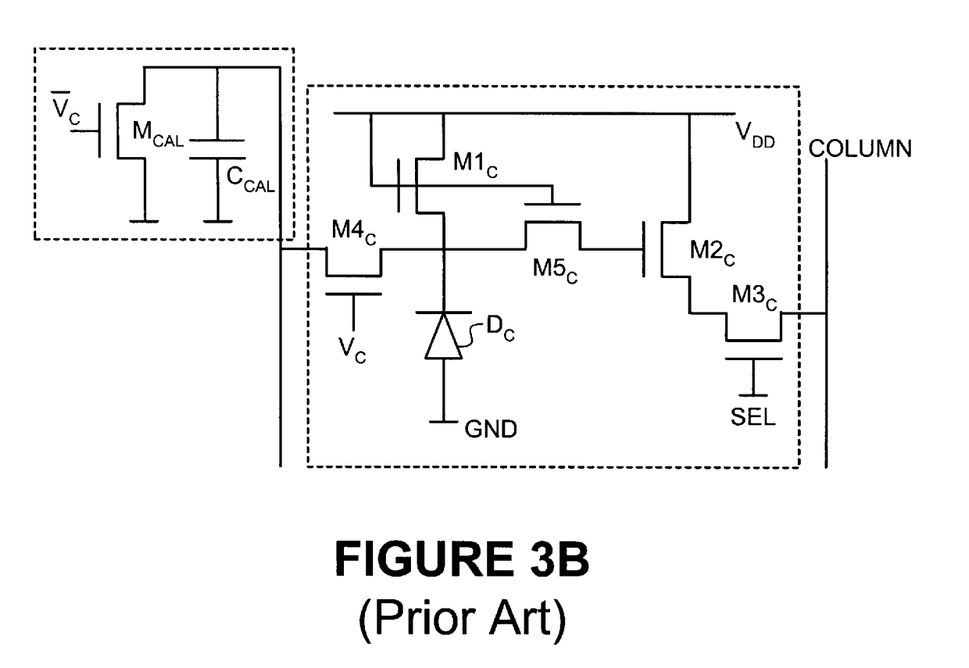

As shown in FIG. 3B, the current source designated as $I_{CAL}$ may be implemented using switches and capacitors. This is stated to be preferred because a very good reproducibility can be achieved among columns. The calibration source consisting of a capacitor $C_{CAL}$ and a transistor $M_{CAL}$ used as a switch, is common for each column of pixels. For simplicity only one pixel is drawn.

In a simulation designed to show the results of a pixel similar to that shown in FIG. 3B, the "On-Chip Offset Calibrated Logarithmic Response Image Sensor" (supra) reference shows that right after the calibration pulse $V_c$ goes high, it forces the pixel output to zero voltage. The photocurrent then charges the calibration capacitance $C_{CAL}$ until $V_c$ goes low again. Then, the pixel voltage returns to its value before the application of the calibration pulse with a time constant determined by the pixel capacitance and the transconductance of the biasing transistor M1C. This transistor is biased in the weak inversion region, therefore its transconductance is proportional to the photocurrent. In the sensor under examination, this time constant for the medium light levels is in the order of a few ms. A very important observation is pointed out, in that for some microseconds right after the instant that $V_C$ goes low, the pixel output is independent of the light level. Therefore, the above scheme for FIG. 3B is effectively identical to the calibration with the current source shown in FIG. 3A. The readout sequence is accomplished in two phases. First, before the application of the calibration pulse, the pixel output is sampled and stored. Then, the calibration pulse is applied and a few microseconds later the pixel output is again sampled and stored. The difference between these two stored values depends on the photocurrent and is free from offsets imposed by variations in pixel transistor parameters.

Another prior art circuit intended to deal with the problem of FPN in logarithmic image sensors is shown in "Self-Calibrating Logarithmic CMOS Image Sensor with Single Chip Camera Functionality" (M. Loose et al., 1999 *IEEE Workshop on Charge-Coupled Devices and Advanced Image Sensors*, pp. 191–194). FIG. 1 of that reference has been reproduced as FIG. 4 herein. As stated, the calibration concept is based on the fact that the sensor circuit can be stimulated not only by the photodiode but also by a reference current. The output signal corresponding to this reference current is ideally the same for all pixels but in reality differs from pixel to pixel caused by device-to-device variations. A differential amplifier compares the real pixel output to a reference voltage and adjusts the pixel until both voltages are equal. The calibrated pixel state is finally stored on a capacitor working as an analog memory cell.

Figure 4:
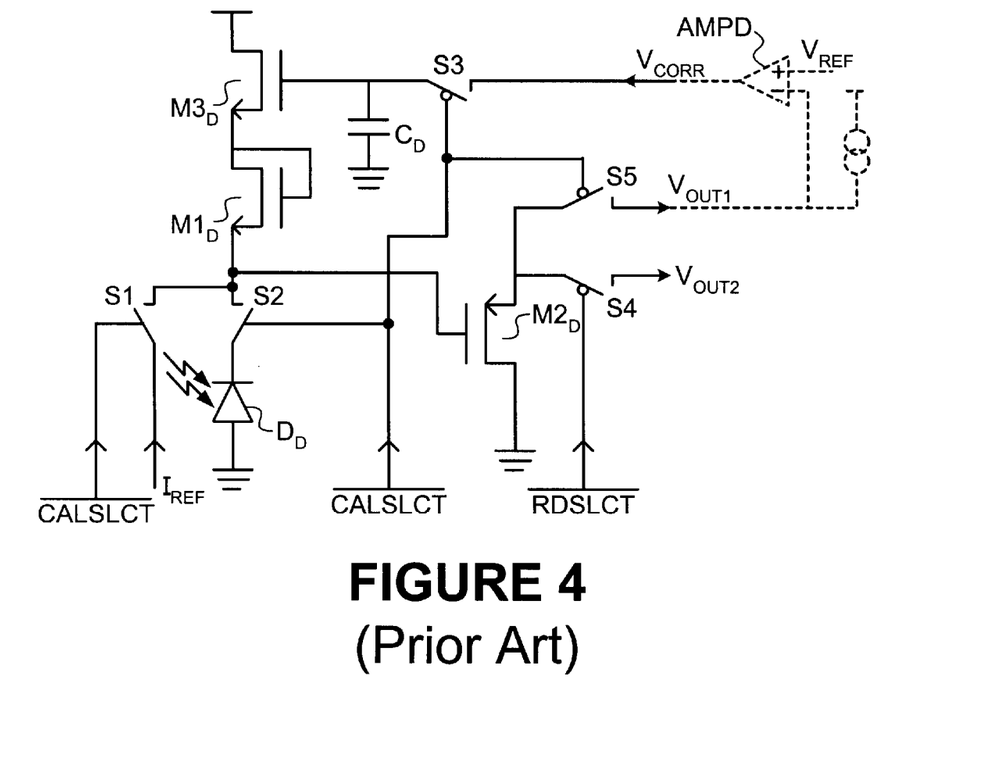
FIG. 4 is a schematic diagram of a prior art logarithmic response image sensor utilizing a structure for adjusting the sensor relative to a calibration signal level.

FIG. 4 shows the schematic diagram of the offset-correcting pixel. The switches $S_1$ to $S_5$ are realized by single MOS transistors. During readout mode, the switch $S_2$ is closed leading to a current path from the photodiode through the transistors M1D and M3D to $V_{dd}$. M1D and M3D work in weak inversion and convert the photocurrent into a logarithmic voltage. The pixel output voltage, buffered by transistor M2D, can be read out through the $V_{out2}$ line by closing the selection switch $S_4$. By opening $S_2$ and closing $S_1$, $S_3$ and $S_5$, the receptor circuit changes to calibration mode. It is now stimulated by the reference current $I_{ref}$. The output signal is guided through $V_{out1}$ to the input of the calibrating operational amplifier AMPD at the end of each column. This autozeroing amplifier AMPD compares $V_{out1}$ to a voltage $V_{ref}$ and produces the correction voltage $V_{corr}$. Since $V_{corr}$ is connected to the gate of M3D, a change of this voltage leads to a change in the pixel output voltage. The calibration amplifier $AMP_D$ moves $V_{corr}$ until the difference between $V_{out1}$ and $V_{ref}$ becomes zero. Finally the correction voltage is stored on the capacitor $C_D$ by opening $S_3$.

The above prior art methods for developing a reference current in a logarithmic response image sensor have a number of drawbacks. For example, with reference to the column line shown in FIG. 3B for the calibration current, extra power is required by the circuit for charging and discharging any existing capacitance. For example, the extra capacitor $C_{CAL}$ must be charged and discharged each time there is a voltage change on the column line. This results in extra power consumption by the circuit. In addition, the structure itself is an extra column line that is required solely for the purpose of providing the reference current. As stated, the capacitor and switch implementation of FIG. 3B is used to attempt to obtain good reproducibility among the columns, which is relatively difficult to achieve for current sources. As further described with reference to FIG. 4, the setting and control of a reference current can be very difficult.

The present invention is directed to a logarithmic response image sensor that overcomes the foregoing and other disadvantages. More specifically, the present invention is directed to a pixel structure for a CMOS image sensor that can cancel fixed pattern noise due to offset and gain mismatch in a logarithmic response image sensor.

SUMMARY OF THE INVENTION

An improved pixel structure for a logarithmic response image sensor is provided. The pixel structure and readout sequence provides a method to get a signal free from offsets and gain mismatch due to non-uniformities in the device parameters.

In accordance with one aspect of the invention, the image sensor includes a calibration transistor in addition to a standard logarithmic response CMOS pixel structure. The calibration transistor receives a calibration signal and operates to cause the image sensor to output a calibration signal level, which can be processed with the sensed signal level to produce an output that is free from offsets and gain mismatch due to non-uniformities in the device parameters.

In accordance with another aspect of the invention, the calibration transistor may be coupled internally within the pixel structure itself, so that an additional column line is not required to produce the calibration signal. In this structure, the calibration transistor may be coupled to the node between the load transistor and the photosensitive device.

Thus, when the calibration transistor is biased in the conducting state, at least part of the current that flows through it also flows through the load transistor.

In accordance with another aspect of the invention, the calibration transistor may be coupled to an external column reference voltage line. In this structure, the column reference voltage line is coupled by the calibration transistor to the gate of the third transistor that is coupled in series with the output of the image sensor.

In accordance with another aspect of the invention, the calibration transistor receives the current that it conducts from a voltage line which is coupled to a voltage source, rather than a current source. In this manner, the inherent disadvantages of attempting to utilize a current source for the calibration method, such as the difficulties of controlling the current source, as well as the additional power consumption, are avoided.

It will be appreciated that the disclosed image sensor has numerous advantages over prior art methods and circuits for obtaining a reference signal in a logarithmic response type system. The present invention avoids the control problems, power consumption, and additional circuitry required by the prior art methods.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 5:
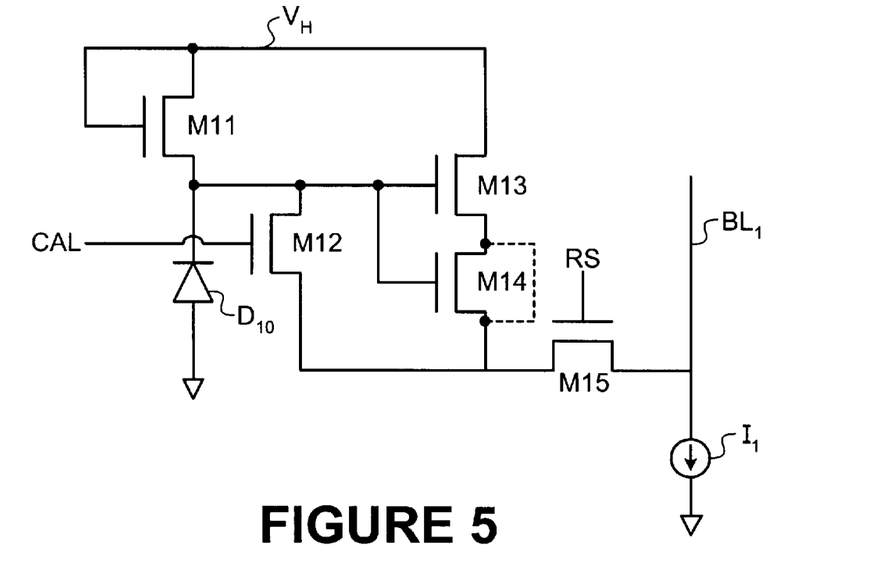
FIG. 5 is a schematic diagram of a logarithmic response image sensor according to the present invention in which the calibration transistor is coupled between the output of the photosensitive device and the row select transistor.

A logarithmic response image sensor formed in accordance with a preferred embodiment of the present invention is illustrated in FIG. 5. The circuit includes a photosensitive device D10, which outputs a sensor potential according to a photo response. The photosensitive device D10 is coupled between ground and a first transistor M11. Transistor M11 is coupled between the photosensitive device D10 and a voltage line $V_H$. The voltage level of the voltage line $V_H$ may be that of a voltage source, such as $V_{DD}$. The gate of the first transistor M11 is also coupled to the voltage line $V_H$. The first transistor M11 may therefore be said to act as a load transistor. As will be described in more detail below with reference to FIG. 9, the first transistor M11 may be biased in the weak inversion region by the current of the photosensitive device D10. A second transistor M12 is coupled through the first transistor M11 to the voltage line $V_H$. The second transistor M11 can be referred to as a calibration transistor, as its gate is coupled to a calibration control signal line CAL.

The node between the first transistor M11 and the photosensitive device D10 is coupled to the gate of a third transistor M13. The third transistor M13 is coupled between the voltage line $V_H$ and a fourth transistor M14. The dotted line around the fourth transistor M14 indicates that it is not critical for the circuit's operation, and thus in an alternate embodiment it may be replaced with a short-circuit along the dotted line. The fourth transistor M14 is coupled to a fifth transistor M15. The gate of the fifth transistor is coupled to a row select control line RS. The fifth transistor M15 is coupled between a bit line BL1 and the node between the second transistor M12 and fourth transistor M14. The gate of the fourth transistor M14 is coupled to the gate of the third transistor M13. The second transistor M12 is coupled between the fifth transistor M15 and the gate of the third transistor M13. The bit line BL includes a current source $I_1$, as is well known in the art.

It should be noted that the calibration transistor M12 is not coupled to an extra column line with an extra current source, as was done in the prior art. Thus, FIG. 5 illustrates an improved structure in which the extra column line and current source are not required. This avoids the additional power consumption, control issues for the calibration current, and additional circuitry required by the prior art methods. As will be described in more detail below with reference to FIG. 9, the transition of the calibration control signal line CAL is designed to produce a selected calibration reference signal level on the bit line BL.

Figure 6:
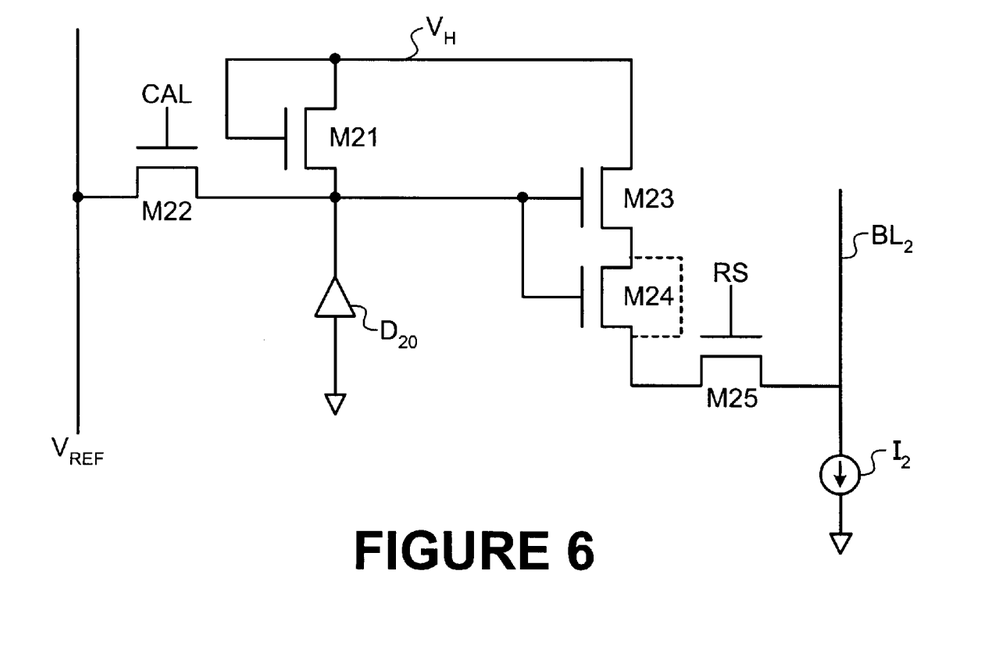
FIG. 6 is a schematic diagram of a logarithmic response image sensor according to the present invention in which the calibration transistor is coupled between a column reference voltage line and the output of the photosensitive device.

FIG. 6 illustrates another embodiment of the invention. FIG. 6 has a somewhat similar structure to FIG. 5, with the exception that the calibration transistor has been relocated and a new column reference voltage line has been added. Similar to FIG. 5, FIG. 6 includes a photosensitive device D20, a first transistor M21, a second transistor M22, a third transistor M23, a fourth transistor M24, and a fifth transistor M25, along with a bit line BL2 with a current source I2. FIG. 6 also includes a new column reference voltage line $V_{REF}$. The connections of the various transistors and elements of FIG. 6 are similar to those of FIG. 5, with the exception that the second transistor M22 has been relocated. The dotted line around the transistor M24 indicates that it is not critical for the circuit's operation, and thus in an alternate embodiment it may be replaced with a short circuit along the dotted line.

As shown in FIG. 6, the second transistor M22 is now coupled between the column reference voltage line $V_{REF}$ and the node between the first transistor M21 and the photosensitive device D20. The gate of the calibration transistor M22 is still coupled to the calibration control signal line CAL. As illustrated in FIG. 6, when the second transistor M22 is biased on by a signal on the calibration control signal line CAL, the column reference voltage line $V_{REF}$ determines the voltage on the gate of the third transistor M23. This biasing of the third transistor M23 determines the output of the logarithmic response image sensor on the bit line BL2, and thus defines the calibration signal level.

The use of the column reference voltage line $V_{REF}$ allows the circuit to operate in a more efficient manner than certain prior art circuits that utilize a current source with additional capacitance as part of an extra column line. Such prior art circuits require additional control and timing considerations, as well as resulting in higher power consumption.

Figure 7:
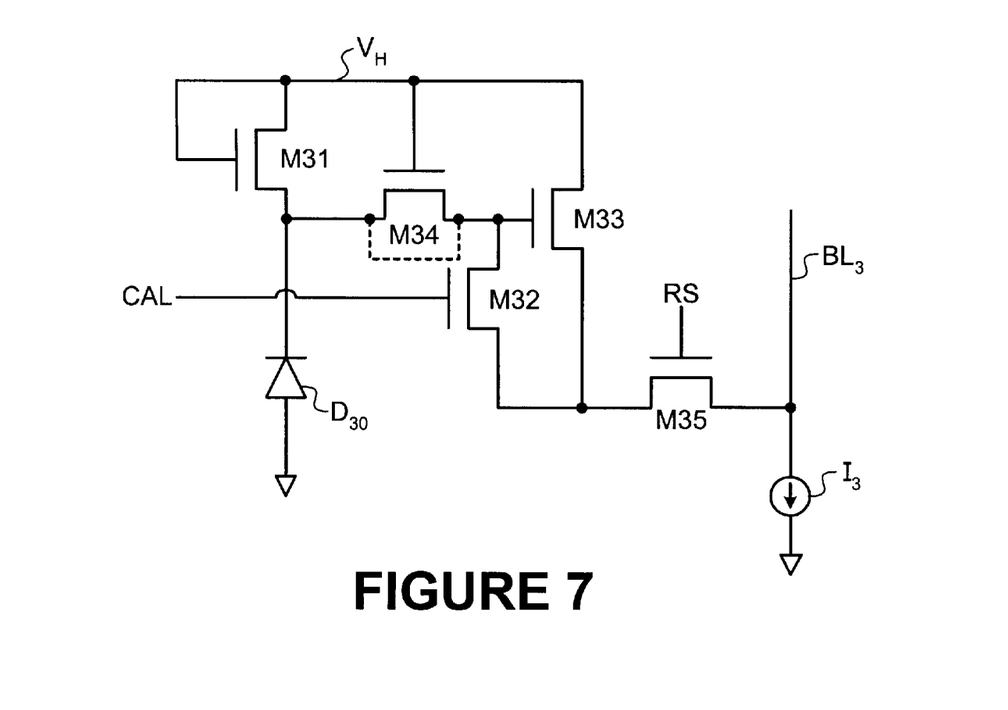
FIG. 7 is a schematic diagram of a logarithmic response image sensor according to the present invention in which the calibration transistor is coupled between an additional transistor and the row select transistor.

FIG. 7 illustrates another embodiment of the invention. FIG. 7 is similar to FIG. 5, except that the fourth transistor has been relocated. Similar to FIG. 5, FIG. 7 includes a photosensitive device D30, a first transistor M31, a second transistor M32, a third transistor M33, a fourth transistor M34, a fifth transistor M35, and a bit line BL3 with a current source 13. The connections of the various transistors of FIG. 7 are similar to those of FIG. 5, with the exception that the fourth transistor M34 has been relocated.

As shown in FIG. 7, the fourth transistor M34 is coupled between the gate of the third transistor M33 and the node between the first transistor M31 and the photosensitive device D30. The gate of the fourth transistor M34 is coupled to the voltage line $V_H$. The dotted line around the transistor M34 indicates that it is not critical to the circuit's operation, and in an alternate embodiment may be replaced with a short circuit along the dotted line. The advantages of FIG. 7 are similar to those of FIG. 5, with the differences being related to the location of the fourth transistor.

Figure 8:
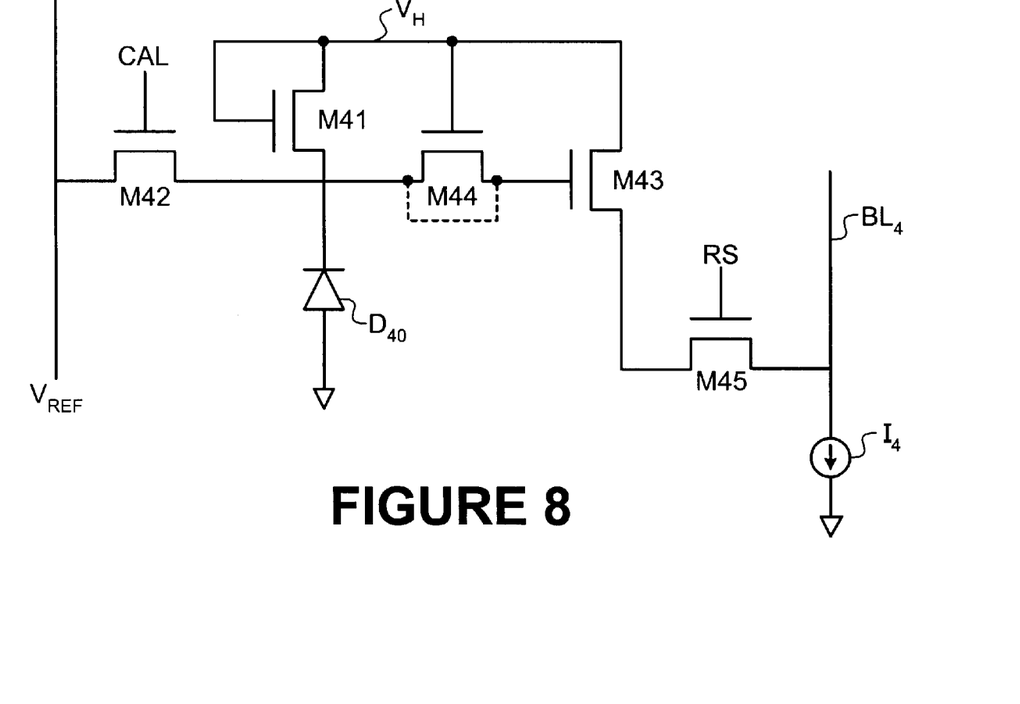
FIG. 8 is a schematic diagram of a logarithmic response image sensor according to the present invention in which the calibration transistor is coupled between the column reference voltage line and the output of the photosensitive device, and in series with an extra transistor.

FIG. 8 illustrates another embodiment of the invention. The circuitry of FIG. 8 is similar to that of FIG. 6, except that the fourth transistor has been relocated. Similar to FIG. 6, FIG. 8 includes a photosensitive device D40, first through fifth transistors M41 through M45, a bit line BL4 with a current source I4, and a column reference voltage line $V_{REF}$. The connections of the transistors and various elements of FIG. 8 are similar to those of FIG. 6, with the exception that the fourth transistor M44 has been relocated.

As shown in FIG. 8, the fourth transistor M44 is coupled between the gate of the third transistor M43 and the node between the photosensitive device D40 and the first transistor M41. The dotted line around the fourth transistor M44 indicates that it is not critical to the circuit's operation, and in an alternate embodiment may be replaced with a short circuit along the dotted line. The gate of the fourth transistor M44 is coupled to the voltage line $V_H$. The advantages of FIG. 8 are similar to those of FIG. 6, with the differences being related to the location of the fourth transistor.

In discussing the method of operation of the above circuits of FIGS. 5–8, it should be recalled that in prior art linear response image sensors, the typical correlated double sampling technique involved subtracting a "dark" signal level from the sensed signal level. These levels could be relatively well defined by being integrated on a capacitor over a well-defined time period during the two different states. As discussed in detail above, the logarithmic response image sensors have typically suffered from high fixed pattern noise due to the non-availability of two distinct pixel levels. In the present invention, a calibration signal level is developed according to a calibration control signal that is based on current levels. The calibration control signal produces a calibration reference signal that may be more generally in a "light" region.

The following mathematical equations describe the subtraction of the calibration reference signal level ($V_{CAL}$) from the sensed signal level ($V_S$) with respect to the output from the load transistor. The initial equations are similar to Equation (1) that was discussed above with respect to FIG. 1.

$$I = I_o e^{\frac{V-V_o}{V_T}} \tag{3}$$

$$V - V_o = V_T (\ln I - \ln I_o) \tag{4}$$

$$V_S - V_o = V_T (\ln I_{PHOTO} - \ln I_o) \tag{5}$$

$$V_{CAL} - V_o = V_T (\ln(I_{CAL} + I_{PHOTO}) - \ln I_o) \tag{6}$$

$$V_{CAL} - V_o = V_T (\ln I_{CAL} - \ln I_o) \quad \text{where } I_{CAL} \gg I_{PHOTO} \tag{7}$$

$$V_S - V_{CAL} = V_T (\ln I_{PHOTO} - \ln I_{CAL}) \tag{8}$$

In the above equations, I is the drain current through the load transistor and V is the gate-source voltage. $V_T$ is the threshold voltage, and $I_O$ and $V_O$ are other constants. $I_{PHOTO}$ is the current controlled by the photosensitive device, and $V_S$ is the related voltage. $I_{CAL}$ is the current as controlled by the calibration transistor, and $V_{CAL}$ is the related voltage.

Figure 9:
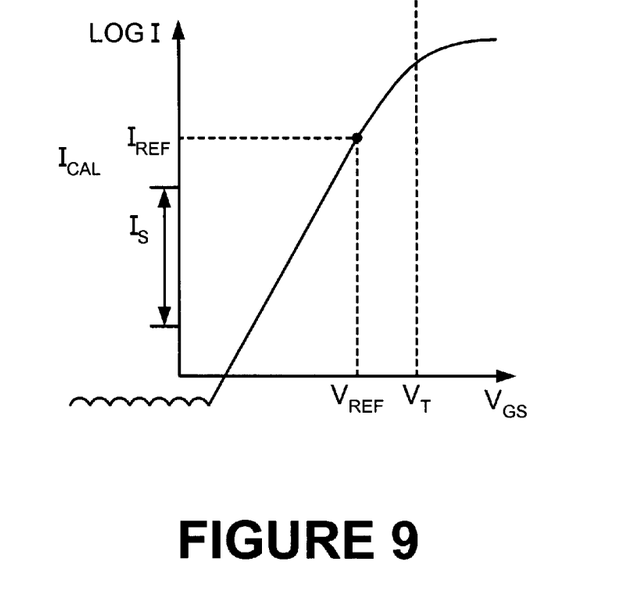
FIG. 9 is a graph of the gate-source current voltage versus the logarithmic current, illustrating the selection of the reference levels.

FIG. 9 shows a graph of the gate-source voltage versus the logarithmic current of a logarithmic response image sensor. As shown, the region of interest is generally in the weak inversion region. As shown, in accordance with the present invention a reference calibration current level $I_{REF}$ may be determined according to a reference calibration voltage level $V_{REF}$. The reference level $V_{REF}$ may be selected according to a selected light current level, as opposed to the prior art correlated double sampling methods for linear sensors, which were typically set according to a relatively distinct dark pixel level.

While the preferred embodiment of the invention and several alternate embodiments have been illustrated and described, it will be appreciated that various changes can be made therein without departing from the spirit and scope of the invention. One of ordinary skill in the art after reading the foregoing specification will be able to affect various changes, alterations, and substitutions of equivalents without departing from the broad concepts disclosed. It is therefore intended that the scope of the letters patent granted hereon be limited only by the definitions contained in the appended claims and equivalents thereof, and not by limitations of the embodiments described herein.

The embodiments of the invention in which an exclusive property or privilege is claimed are defined as follows:

1. A logarithmic response image sensor comprising:
    a photosensitive device with an output that varies according to the light sensed by the photosensitive device;
    a first transistor coupled in series with the photosensitive device;
    a second transistor directly coupled to the photosensitive device, the second transistor having a gate;
    a calibration-control signal line coupled to the gate of the second transistor; and
    a voltage line couple to a voltage source, the second transistor conducting a current from the voltage line when the second transistor is biased on by a signal on the calibration control signal line, the signal on the calibration control signal line causing the image sensor to output a calibration signal level.

2. The logarithmic response image sensor of claim 1, wherein the first transistor is coupled between the voltage line and the photosensitive device, the voltage line providing current conducted by the first transistor and the second transistor, the logarithmic response image sensor thereby not requiring an additional column line to provide the current conducted by the second transistor.

3. The logarithmic response image sensor of claim 2, further comprising a third transistor having a gate, the third transistor also being coupled to the voltage line and also conducting current from the voltage line, the gate of the third transistor being coupled to the second transistor.

4. The logarithmic response image sensor of claim 3, further comprising a fourth transistor coupled in series with the third transistor.

5. The logarithmic response image sensor of claim 3, further comprising a fourth transistor coupled between the gate of the third transistor and the node between the first transistor and the photosensitive device.

6. The logarithmic response image sensor of claim 1, further comprising a bit line and a row select transistor, the row select transistor being coupled to the bit line to provide the output of the logarithmic response image sensor.

7. A logarithmic response image sensor comprising:
a photosensitive device with an output that varies according to the light sensed by the photosensitive device;
a first transistor coupled in series with the photosensitive device;
a second transistor coupled to the photosensitive device, the second transistor having a gate;
a calibration control signal line coupled to the gate of the second transistor;
a voltage line couple to a voltage source, the second transistor conducting a current from the voltage line when the second transistor is biased on by a signal on the calibration control signal line, the signal on the calibration control signal line causing the image sensor to output a calibration signal level; and
a second voltage line coupled to a voltage source, the first transistor being couple between the second voltage line and the photosensitive device.

8. The logarithmic response image sensor of claim 7, further comprising a third transistor coupled to the second voltage line, the third transistor having a gate that is coupled to the first voltage line by the second transistor.

9. The logarithmic response image sensor of claim 8, further comprising a fourth transistor coupled in series with the third transistor.

10. The logarithmic response image sensor of claim 8, further comprising a fourth transistor coupled between the second transistor and the gate of the third transistor.

11. A logarithmic response image sensor comprising:
a photosensitive device;
a first transistor coupled to the photosensitive device, at least part of the current through the first transistor also passing through the photosensitive device;
a second transistor coupled to the photosensitive device, the second transistor having a gate; and
a calibration control signal line coupled to the gate of the second transistor, the calibration control signal line controlling the second transistor so as to cause the second transistor to conduct current from a source other than a calibration current source and thereby cause the logarithmic response image sensor to output a calibration signal level.

12. A logarithmic response image sensor comprising:
a photosensitive device;
a first transistor coupled to the photosensitive device, at least part of the current through the first transistor also passing through the photosensitive device;
a second transistor coupled to the photosensitive device, the second transistor having a gate;
a calibration control signal line coupled to the gate of the second transistor, the calibration control signal line controlling the second transistor so as to cause the second transistor to conduct current from a source other than a calibration current source and thereby cause the logarithmic response image sensor to output a calibration signal level; and
a voltage line and a row select transistor, the first transistor being coupled between the voltage line and the photosensitive device, the second transistor being coupled between the row select transistor and the node between the first transistor and the photosensitive device.

13. A logarithmic response image sensor comprising:
a photosensitive device;
a first transistor coupled to the photosensitive device, at least part of the current through the first transistor also passing through the photosensitive device;
a second transistor coupled to the photosensitive device, the second transistor having a gate;
a calibration control signal line coupled to the gate of the second transistor, the calibration control signal line controlling the second transistor so as to cause the second transistor to conduct current from a source other than a calibration current source and thereby cause the logarithmic response image sensor to output a calibration signal level; and
a column reference voltage line coupled to a voltage source, and also comprising a third transistor with a gate, the second transistor coupling the column reference voltage line to the gate of the third transistor.

14. A logarithmic response image sensor comprising:
a photosensitive device;
a first transistor coupled to the photosensitive device, at least part of the current through the first transistor also passing through the photosensitive device;
a second transistor directly coupled to the photosensitive device, the second transistor having a gate; and
a calibration control signal line coupled to the gate of the second transistor, the calibration control signal line controlling the second transistor so as to cause the logarithmic response image sensor to change between outputting a sensed signal level and a calibration signal level, the change between the sensed signal level and the calibration signal level not requiring the charging or discharging of any additional capacitance that is part of a calibration current source.

15. A logarithmic response image sensor comprising:
a photosensitive device;
a first transistor coupled to the photosensitive device, at least part of the current through the first transistor also passing through the photosensitive device;
a second transistor directly coupled to the photosensitive device, the second transistor having a gate;
a calibration control signal line coupled to the gate of the second transistor, the calibration control signal line controlling the second transistor so as to cause the logarithmic response image sensor to change between outputting a sensed signal level and a calibration signal level, the change between the sensed signal level and the calibration signal level not requiring the charging or discharging of any additional capacitance that is part of a calibration current source; and a voltage line and the photosensitive device, the second transistor being coupled between the row select transistor and the node between the first transistor and the photosensitive device.

16. A logarithmic response image sensor comprising:

a photosensitive device;

a first transistor coupled to the photosensitive device, at least part of the current through the first transistor also passing through the photosensitive device;

a second transistor directly coupled to the photosensitive device, the second transistor having a gate;

a calibration control signal line coupled to the gate of the second transistor, the calibration control signal line controlling the second transistor so as to cause the logarithmic response image sensor to change between outputting a sensed signal level and a calibration signal level, the change between the sensed signal level and the calibration signal level not requiring the charging or discharging of any additional capacitance that is part of a calibration current source; and a column reference voltage line coupled to a voltage source, and also comprising a third transistor with a gate, the second transistor coupling the column reference voltage line to the gate of the third transistor.

17. A logarithmic response image sensor comprising;

a photosensitive device with an output that varies according to the light sensed by the photosensitive device;

a voltage line for providing energy to the logarithmic response image sensor;

a first transistor coupled between the voltage line and the photosensitive device;

a second transistor with a gate, the second transistor being directly coupled to the node between the first transistor and the photosensitive device;

a calibration control signal line coupled to the gate of the second transistor, the second transistor being biased on by a signal on the calibration control signal line, the second transistor when biased on conducting at least part of the current that flows through the first transistor, the first transistor not being regulated by an additional current source to control the current that it conducts.

18. A logarithmic response image sensor comprising;

a photosensitive device with an output that varies according to the light sensed by the photosensitive device;

a voltage line for providing energy to the logarithmic response image sensor;

a first transistor coupled between the voltage line and the photosensitive device;

a second transistor with a gate, the second transistor being directly coupled to the node between the first transistor and the photosensitive device;

a calibration control signal line coupled to the gate of the second transistor, the second transistor being biased on by a signal on the calibration control signal line, the second transistor when biased on conducting at least part of the current that flows through the first transistor, the first transistor not being regulated by an additional current source to control the current that it conducts; and a row select transistor, the second transistor being coupled between the row select transistor and the node between the first transistor and the photosensitive device.

* * * * *

UNITED STATES PATENT AND TRADEMARK OFFICE
CERTIFICATE OF CORRECTION

PATENT NO. : 6,355,965
DATED : March 12, 2002
INVENTOR(S) : He et al.

It is certified that error appears in the above-identified patent and that said Letters Patent is hereby corrected as shown below:

<u>Title page,</u>
ABSTRACT, line 1, "logarithm" should be -- logarithmic --;

<u>Column 8,</u>
Line 56, delete hyphen between "calibration" and "control";

Signed and Sealed this

Twenty-first Day of May, 2002

Attest:

JAMES E. ROGAN
*Attesting Officer*   *Director of the United States Patent and Trademark Office*